United States Patent
Farnworth

[11] Patent Number: 5,933,713
[45] Date of Patent: Aug. 3, 1999

[54] METHOD OF FORMING OVERMOLDED CHIP SCALE PACKAGE AND RESULTING PRODUCT

[75] Inventor: Warren M. Farnworth, Nampa, Id.

[73] Assignee: Micron Technology, Inc., Boise, Id.

[21] Appl. No.: 09/056,124

[22] Filed: Apr. 6, 1998

[51] Int. Cl.[6] ............ H01L 21/44; H01L 21/48; H01L 21/50
[52] U.S. Cl. .......... 438/127; 438/106; 438/612; 438/613
[58] Field of Search .................. 438/127, 106, 438/612, 613

[56] References Cited

U.S. PATENT DOCUMENTS

| 4,807,021 | 2/1989 | Okumura. | |
|---|---|---|---|
| 5,071,787 | 12/1991 | Mori et al. . | |
| 5,462,636 | 10/1995 | Chen et al. | 438/462 |
| 5,496,775 | 3/1996 | Brooks | 438/127 |
| 5,593,927 | 1/1997 | Farnworth et al. . | |
| 5,639,695 | 6/1997 | Jones et al. | 438/126 |
| 5,672,542 | 9/1997 | Schwiebert et al. . | |
| 5,683,942 | 11/1997 | Kata et al. | 438/123 |
| 5,703,406 | 12/1997 | Kang . | |

Primary Examiner—Kevin M. Picardat
Assistant Examiner—Dever Collins
Attorney, Agent, or Firm—Trask, Britt & Rossa

[57] ABSTRACT

A method for forming a semiconductor device includes forming a conductive bump on one or more of pads of a semiconductor substrate. A top or uppermost portion of each conductive bump is then planarized. The exposed portions of a main surface of the semiconductor wafer are filled with a layer of encapsulation material. The conductive bumps are reformed to their preplanarized shape and the semiconductor wafer is then diced to form singulated semiconductor dice. A preferred method of the invention also includes placing each singulated die in a mold to complete a second encapsulation step wherein a layer of encapsulation material is formed on the back surface or, alternatively, on the back and side surfaces of the semiconductor die in order to encapsulate the back, or the back and sides, of the semiconductor die. The second encapsulation step can be accomplished either before or after the conductive bumps are reformed to their preplanarized shape, the back surface of the semiconductor wafer is layered with the encapsulating material, or the semiconductor wafer is diced.

34 Claims, 5 Drawing Sheets

METHOD OF FORMING OVERMOLDED CHIP SCALE PACKAGE AND RESULTING PRODUCT

BACKGROUND OF THE INVENTION

1. Field of the Invention

The present invention relates to semiconductor devices and methods for fabricating semiconductor devices. More specifically, the invention relates to a method for packaging or encapsulating an IC die having conductive bumps or bonds that protrude beyond the IC covering or package.

2. State of the Art

In semiconductor manufacture, a single semiconductor die, chip, or integrated circuit is typically mounted within a sealed package. The package generally protects the die from physical damage and from contaminants, such as moisture or chemicals, found in the surrounding environment. The package also provides a lead system for connecting electrical devices (integrated circuits), formed on the die, to a printed circuit board or other external circuitry.

Semiconductor packages containing integrated circuits for a broad range of purposes are currently mass produced. Measurable savings in the packaging of one such semiconductor die or integrated circuit can generate large overall cost savings, due to large production volumes, if the reduced-cost packaging affords required package integrity. Further, reduction in package size can eliminate size-based restrictions for use of a die on ever more crowded carrier substrates such as printed circuit boards (PCBs), where available "real estate" is at a premium. Therefore, continual cost and quality improvements in the manufacture of these semiconductor packages, while maintaining the overall dimensions of such packages at a reduced size, are of great value in the semiconductor manufacturing field.

In many semiconductor applications, formation of conductive bumps on the bond pads of an IC die is desirable, if not necessary. The most common applications where conductive bumps are used include tape automated bonding (TAB), flip-chip attachment of a die to a carrier substrate, and direct chip attachment (DCA) of a die to a printed circuit board. Formation of the conductive bumps used in these applications can be accomplished using a variety of commonly known methods, such as metal deposition onto bond pads by screening or printing, or ball bumping techniques using wire bonding equipment.

A widely practiced way to increase the number of available input/output (I/O) connections is to use flip-chip methodology for packaging, where an array of contacts (e.g., conductive bumps or balls) is positioned on the active surface or circuit face of the die and the die is mounted circuit face down upon a single chip or multi-chip module carrier.

Because of the high manufacturing costs associated with state-of-the-art metal deposition techniques, many semiconductor manufacturers have resorted to ball bumping processes using standard wire bonding tools to form conductive bumps over the bond pads. In the ball bumping process, a capillary of the wire bonding tool carries a conductive wire toward a bond pad on which a bump is to be formed. A ball is formed at an end of the wire by heating and melting the metal wire. The wire bonding tool capillary then presses the ball against the planar bond pad and the portion of the wire extending past the ball is cut, leaving a ball bump on the bond pad.

A flip-chip or bumped (raised) die is a semiconductor chip (die) having conductive bumps formed on bond pads on the active surface or front side of the die, the conductive bumps being used as electrical and mechanical connectors. The die is inverted (flipped) and bonded to trace ends or other terminals on a carrier substrate by means of the conductive bumps. Several materials are conventionally used to form the conductive bumps on the die, such as solder conductor polymers, and conductor-filled polymers. Typically, if the bumps are solder bumps, the solder bumps are deposited and then reflowed to form a spherical shape, and subsequently reheated to form a solder joint between the bond pads on the so-called flip-chip and the substrate terminals, the solder joint forming both electrical and mechanical connections between the flip-chip and substrate.

Flip-chip IC devices formed according to the aforementioned fabrication processes have a number of shortcomings. For example, since the active surface of the chip is relatively unprotected being covered only with a thin passivation layer, damage to the chip can occur during attachment of the chip to the PCB. Likewise, such defect to the chip can occur during handling of the chip or while conducting reliability testing of the same.

As disclosed in U.S. Pat. No. 5,496,775 to Brooks, encapsulated IC dice having conductive bumps have been developed in an attempt to solve some of these problems. In the fabrication process of Brooks, gold balls, which unction as leads or contacts, are welded in a stacked or tower fashion onto each bond pad of the IC die. The gold ball tower-bonded die is then placed into a mold and onto a first layer of encapsulation material contained therein. A second layer of encapsulation material is then applied over the tower side of the die, which completely covers the die surface, partially submerging the towers in the encapsulant. The encapsulated IC die is removed from the mold and mounted to tab tape or a PCB, with the non-submerged portions of the towers providing an electrical connection thereto. Although these semiconductor packages have solved a number of problems, the fabrication process to form such packages requires numerous fabrication steps and specialized equipment and materials, especially for the creation of the ball towers and the related steps providing encapsulation around the towers. Also, the required formation of multiple stacks of gold balls in the package inevitably increases the vertical size or height of the package.

In view of the foregoing limitations, there is a need in the semiconductor art for an improved method for forming semiconductor packages of compact size ("chip scale packages") having a minimal number of component parts. Specifically, there is a need for an improved method for forming chip scale packages which are adaptable to substrate surfaces having connection points of varying alignment and spacing configurations. There is a further need for an improved method for forming a chip scale package that does not significantly complicate the manufacturing or handling of the integrated circuit and which is repeatable and reliable when using traditional mass production manufacturing techniques. Preferably, the chip scale package can be formed during and simultaneously with the fabrication and assembly of the semiconductor die.

SUMMARY OF THE INVENTION

According to the present invention, a method for forming a semiconductor device includes forming or providing a semiconductor wafer that has an integrated circuit or active surface defining a large plurality of integrated circuit die locations. As used herein, the term "wafer" includes traditional wafer structures as well as silicon-on-insulator (SDI), silicon-on-glass (SOG) and silicon-on-sapphire (SOS) substrates, among others known in the art. The active surface of the semiconductor wafer includes bond pads thereon for making external electrical connections. Conductive bumps or balls are formed on the bond pads. A top or outermost portion of each conductive bump is then planarized, that is, the top portion of each substantially spherical conductive bump is flattened to a common horizontal or vertical plane level. The exposed portions of the active surface of the semiconductor wafer (i.e., those parts not occupied by the conductive bumps) are filled with a layer of encapsulation material. The conductive bumps are then reformed or reshaped from a planarized shape to their preplanarized shape (i.e., substantially spherical shape). The semiconductor wafer is then diced to form singulated semiconductor dice.

In addition to the aforementioned steps, a preferred method of the invention also includes singulating semiconductor dice and placing each singulated die in a mold to complete a second encapsulation step. This second encapsulation step comprises forming a layer of encapsulation material on the back and side surfaces of the semiconductor die in order to substantially or completely encapsulate the back and sides of each semiconductor die. The second encapsulation step can be accomplished either before or after the conductive bumps are reformed to their preplanarized shape, as described above. By combining the previously-described method, wherein the active surface of each semiconductor die is filled with an encapsulation material, with the instant preferred methods, wherein the back and sides of each semiconductor die is covered with an encapsulant, a completely encapsulated chip scale package having raised conductive bumps thereon can be manufactured.

Another preferred method of the invention includes performing all of the previously-described steps for forming conductive bumps on a semiconductor wafer and planarizing the top portion of each conductive bump thereon. The exposed portions of the active surface of the semiconductor wafer are filled with a layer of encapsulation material. The back surface of the semiconductor wafer opposing the active surface is then filled with a layer of encapsulation material to further protect the back surface of the semiconductor wafers. Finally, the conductive bond is reformed or reshaped from a planarized shape to its preplanarized shape (i.e., substantially spherical shape). The encapsulated semiconductor wafer is then diced to form singulated semiconductor dice. The reforming step can be conducted either before or after the back surface of the semiconductor wafer is layered with the encapsulating material, or alternatively, before or after the semiconductor wafer is diced.

Yet another preferred method of the invention includes forming a semiconductor die with a front surface, a back surface, and sides. The front surface of the semiconductor die includes bond pads thereon. A conductive bump is then formed on at least one of the pads. An outermost or top portion of the conductive bond is then planarized and a layer of encapsulation material is formed on the semiconductor die in order to fill the back surface and sides of the semiconductor die and to fill the exposed portions of the front surface of the semiconductor die surrounding the conductive bumps. Finally, the conductive bumps are reformed to a preplanarized shape.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

A first fabrication process of the invention is depicted in FIGS. 1 through 6, which figures include a semiconductor substrate 20 having bond pads 24 on an active surface 22 thereof. For purposes of simplicity, elements common to FIGS. 1 through 6 will hereinafter be numbered identically in subsequent figures illustrating other preferred methods according to the present invention. The first fabrication process is initiated by applying, such as by stenciling, a solder paste 28 onto bond pads 24. A proper amount of solder paste must be used to adequately cover the bond pads 24, to remain tacky without slumping, and to create a bond ball having sufficient size for the intended application when reflowing the solder paste.

Figure 1:
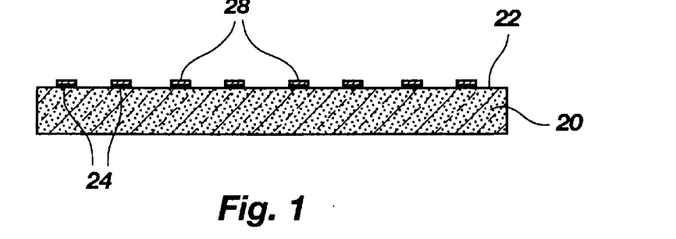
FIGS. 1 through 6 illustrate cross-sectional views of the process steps used in carrying out the method of the present invention.

Prior to the application of the solder paste 28, the bond pads 24 may be pretreated to enhance the connection formed between the solder paste and the bond pads 24. To do so, a three-dip process can be carried out, wherein the bond pads 24, conventionally made of a material such as aluminum, are dipped in a tank containing liquid zincate for approximately 60 seconds. After a zincate layer has been formed on the bond pads 24, the bond pads 24 are immersed in nickel, which results in the nickel replacing the zincate to form a layer of nickel that overlies the aluminum bond pads 24. Palladium can then be deposited over the nickel coating through an electroless deposition process for 60 seconds at about 80° C. to provide an oxide-free attachment on the surface of the bond pads 24. The palladium coating advantageously protects the nickel from oxidizing. Additionally, the palladium coating further enhances the point of interconnection between the solder paste 28 and the bond pads 24 by being absorbed into the tin/lead forming the solder paste 28 to create a continuous connection therebetween.

Suitable solder pastes for use with the instant process can comprise any combination of chemical components that produce paste properties resulting in the desired chemical and physical characteristics for application (e.g., bonding characteristics and viscosity), reflow, cleaning, and for formation of the final encapsulated, raised ball-bond semiconductor structure. For example, the selected solder paste should be able to substantially retain the original printed or dot-dispensed pattern at room temperature and during reflow. Because the spacing or pitch between bond pads is continually decreasing in the art, the control of slump is increasingly critical to the prevention of bridging and shorting between bond pads. Likewise, the solder paste must, when reflowed, as described hereafter, uniformly coalesce to a substantially spherical ball that is substantially free of surrounding small satellite balls.

Preferably, the solder paste is a low melting-point alloy, usually of lead (Pb)-tin (Sn), that can wet copper, conduct current, and mechanically join conductors and the like. Other suitable ingredients for use as a solder paste include, without limitation, aluminum, palladium, gold, copper, indium, tin lead, silver, and combinations or alloys thereof The solder paste includes a blend of the desired weight percent of alloy powder into a flux to produce a homogeneous product. The viscosity of the solder paste should be adjusted, if necessary, to prevent problems such as spattering, excessive slump, overly-rapid drying on the stencil screen, and accompanying loss of tack, clogging of stencil stringing, smearing, inadequate solder deposition, and nonwetting. Use of solder pastes containing solvent-soluble and water-soluble ingredients is preferred since these ingredients evaporate during the reflow process, thus leaving a residue that is, by formulation, removable with either water or solvent.

Figure 2:
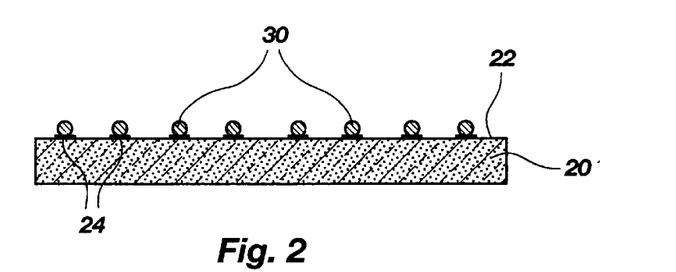

Once solder paste 28 has been applied to bond pads 24, the solder paste 28 is reflowed to form substantially spherical balls 30 (i.e., conductive bumps), as illustrated in FIG. 2. The solder paste can be melted by any suitable means, such as resistance or hot gas heating, forced air oven, radiant heating, liquid immersion, vapor phase condensation methods, or by any method of reflowing known in the art. Temperatures used to accomplish the reflowing of the solder paste are necessarily dependent on the composition of the solder paste being used. Heating times and temperatures must, therefore, be closely controlled to prevent melting or decomposition of the semiconductor substrate 20, including the substructures thereon (e.g., bond pads 24 and the underlying integrated circuitry). With these variables in mind, an appropriate solder paste must be selected for use in conjunction with a selected semiconductor substrate.

It is noted that any size of ball 30 may be formed so long as the dimensions of the ball comply with design constraints of the final semiconductor device. For most applications, balls 30 will preferably have a diameter of from about 5 mil to about 15 mil. Because larger and smaller ball bond dimensions are envisioned for a variety of structures, other sized balls may be similarly manufactured. In this embodiment, it is desirable that the final height of balls 30 be greater than that of the encapsulating material which will cover the active surface and surround the semiconductor device upon completion of the method of the present invention, as further described below.

Figure 3:
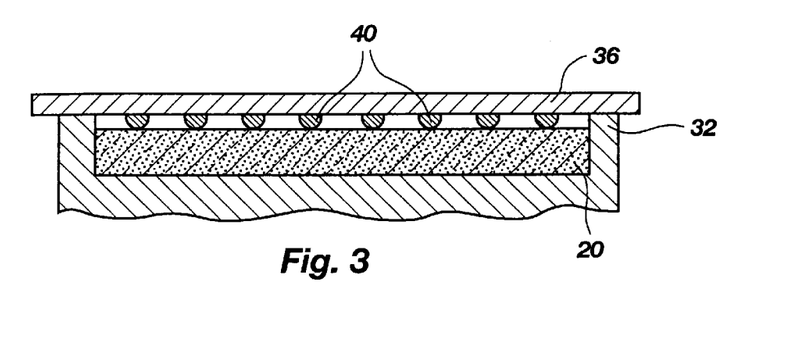
Figure 4:
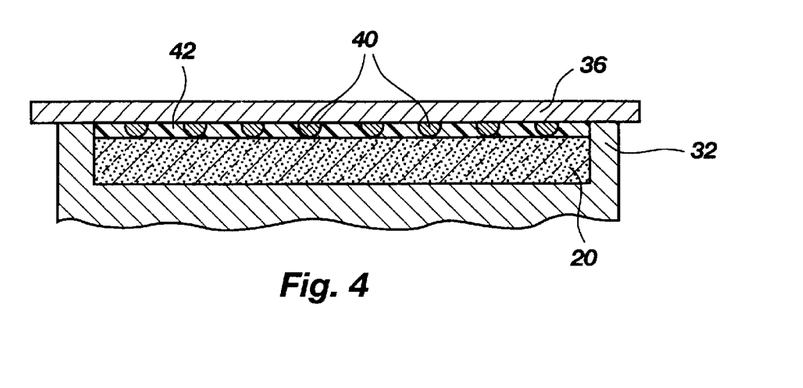

Referring to FIGS. 3 and 4, once balls 30 are formed, semiconductor substrate 20 is placed, with active surface 22 facing up, into the cavity of a mold 32. The uppermost portions of each balls 30 (FIG. 2) are then planarized by attaching and fastening a platen 36 over mold 32, as shown in FIG. 3. It will be appreciated by those skilled in the art that platen 36 and mold 32 reside between the plates of a high pressure, for example, 90-ton, press and is employed in the art of transfer molding. Further, platen 36 may be flat as shown, or define a cavity of like size and shape as substrate 20, and of appropriate depth, to facilitate formation of an encapsulant layer 42 (see FIG. 4) over active surface 22. It will also be appreciated that there is at least one vent aperture (not shown) associated with the chamber defined between mold 32 and platen 36 to permit venting of air from the chamber as encapsulant material is injected therein. Such vents are, of course, designed to prevent extrusion of the molten, pressurized encapsulant therethrough.

By this planarizing step, balls 30 are flattened or planarized at their apices and widened so as to occupy a larger portion of the space overlying (but not necessarily connected to) active surface 22 of semiconductor substrate 20, thus forming planarized balls 40. A molten encapsulating material is then injected -under pressure as known in the art in a transfer-molding operation into the chamber defined between platen 36 and mold 32 to form a layer of encapsulant 42 over the active surface 22 of semiconductor substrate 20. As can be observed in FIG. 4, encapsulant material 42 surrounds planarized balls 40, substantially covering the exposed portions of active surface 22. The thickness of encapsulating material 42 is preferably equal to or less than the height of planarized balls 40.

Any commonly known encapsulant material can be used to form a protective layer over active surface 22. Suitable materials for use as an encapsulant material preferably have low moisture permeability, nonconductivity (i.e., having low ionic contamination), good thermal conductivity, high physical resilience, and a low coefficient of thermal expansion (CTE). Preferred materials include filled polymers such as, by way of example only, epoxies, silicones, silicone-carbon resins, polyimides, and polyurethanes. Glasses may also be employed, such as, by way of example only, phosphosilicate glass (PSG), borosilicate glass (BSG) and borophosphosilicate glass (BPSG).

Figure 5:
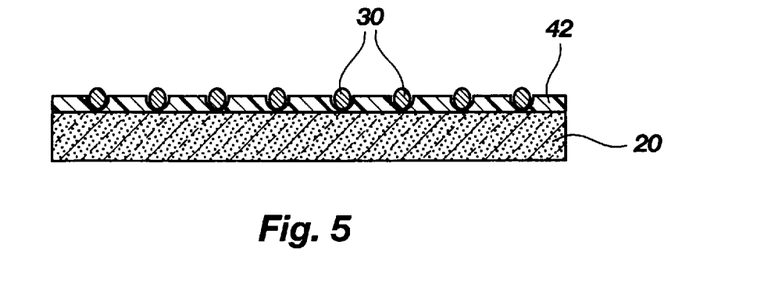
Figure 6:
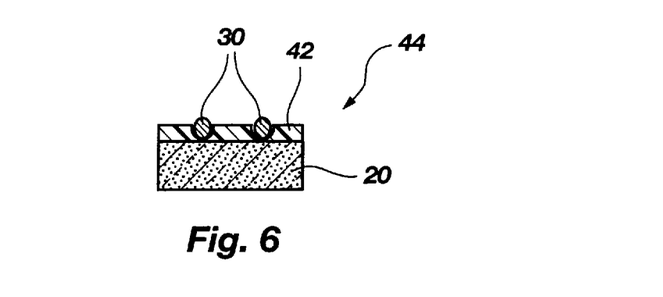

Once planarized balls 40 have been formed and active surface 22 has been covered with encapsulant 42, platen 36 is detached from mold 32 and semiconductor substrate 20 is removed from the cavity of mold 32. Planarized balls 40 are once again heated and reflowed, as described in conjunction with FIG. 2, to form substantially spherical balls 30, as shown in FIG. 5. Planarized balls 40 can be reflowed by any of the previously-described means or by any other method for reflowing known in the art. Temperatures used to accomplish the reflowing of planarized balls 40 are necessarily dependent on the composition of the solder paste materials used. Heating times and temperatures must, however, be closely controlled to prevent decomposition of or damage to the semiconductor substrate 20, of any the substructures thereon (e.g., bond pads 24 and integrated circuitry), and of the newly-formed encapsulation material 42. When reflowed, planarized balls 40 preferably coalesce to form substantially solid balls (i.e., conductive bumps) that are substantially free of surrounding small satellite balls.

Where the structure from FIG. 5 comprises a semiconductor wafer, the wafer can be diced or segmented (singulated) to create smaller, individual subsections of the semiconductor wafer, such as a semiconductor die 44 as shown in FIG. 6. Semiconductor die 44 can be singulated by any process known to those skilled in the art, such as sawing or scribing.

There are several methods of attaching the completed bumped die onto a carrier substrate, such as a PCB. For example, it is possible to reflow the balls to the carrier substrate or bias the ball side of the die into a type of receptacle or socket so as to provide easier removal or replacement of parts therein.

A second preferred fabrication process of the present invention includes fabricating the aforementioned semiconductor wafer according to the steps recited in conjunction with FIGS. 1 through 4. The semiconductor wafer resulting from the steps of FIGS. 1 through 4 is then singulated to form semiconductor die 51 (illustrated in FIG. 7), which includes planarized balls 40 and encapsulant layer 42 overlying active surface 22. Semiconductor die 51 is placed into a second mold 38 and an encapsulating material, preferably of the same composition as that of encapsulated layer 42, is injected under pressure into second mold 38 to form a layer of encapsulant material 50 over side surfaces 46 and a back surface 48 of the semiconductor die 51. It is understood that encapsulant material 50 can also be different than encapsulant 42 which was used to form a protective layer over top surface 22 of the semiconductor substrate 20. It is also understood, in actual practice, a large number of dice 51 will be placed cavities of a mold in a transfer-molding apparatus so that hundreds or thousands of dice 51 will be covered with a layer of encapsulant material 50 over their side and back surfaces 46 and 48. As previously described with respect to encapsulation of the active surface 22 of a substrate 20, transfer molding will be effected within chambers defined between a mold and a platen, or two cooperating mold sections, each chamber being appropriately vented as known in the art.

Figure 8:
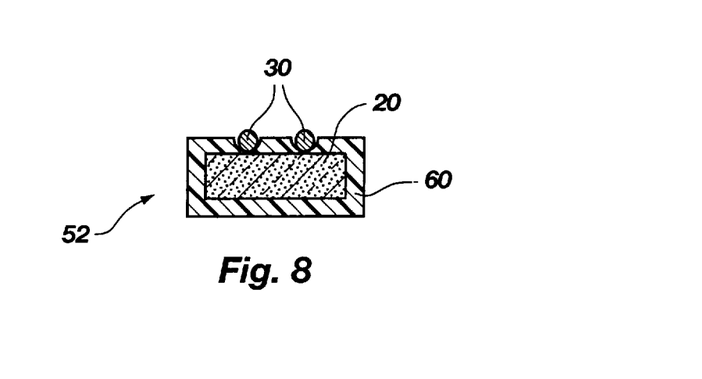

Once the semiconductor die 44 has been removed from second mold 38, planarized balls 40 are reflowed to form substantially spherical balls 30 (i.e., conductive bumps), as shown in FIG. 8. Accomplishment of the instant fabrication process results in a fully encapsulated semiconductor die 52. Semiconductor die 52 includes an encapsulant envelope 60 (composed of encapsulant material layers 42 and 50) that surrounds balls 30, substantially covers the exposed portions of active surface 22, and substantially covers side surfaces 46 and a back surface 48 of semiconductor die 52.

The encapsulating envelope 60 may have any desired thickness on all the surfaces of the die except for active surface 22, which includes balls 30. The thickness of the encapsulating envelope 60 on active surface 22 must be less than the height of balls 30, thereby allowing for subsequent connection to a carrier substrate. It is understood that, although the present embodiment includes balls 30 on only one surface (active surface 22) of the semiconductor die, the limitations on encapsulant thickness applies to any and all die surfaces containing balls 30. As noted above, any known encapsulant material can be used to form the protective layers.

Figure 7:
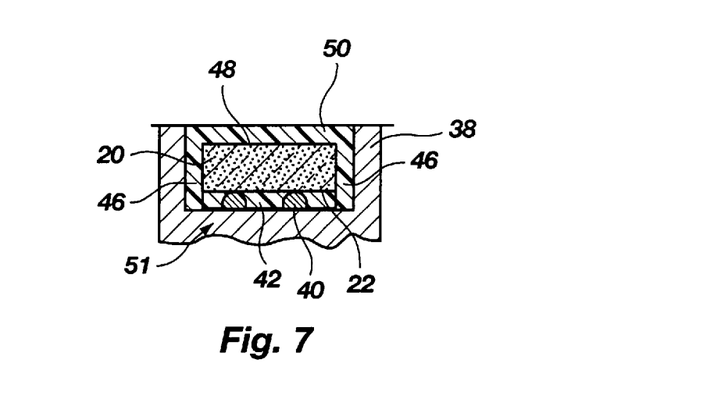
FIGS. 7 and 8 illustrate cross-sectional views of an alternative method of the present invention wherein encapsulation of a semiconductor die is accomplished following completion of the process steps illustrated in FIGS. 1 through 4.

Alternatively, in a third embodiment of the present invention, the process steps recited in conjunction with FIGS. 7 and 8 can be modified so that semiconductor die 44 is fabricated according to the steps recited in conjunction with FIGS. 1 through 6 and includes reflowed balls 30. Thus, in the present process, a singulated semiconductor die 44 having reflowed balls 30 (FIG. 6), rather than semiconductor die 51 having planarized balls 40, is placed in second mold 38 and encapsulated with encapsulating material 50.

Figure 9:
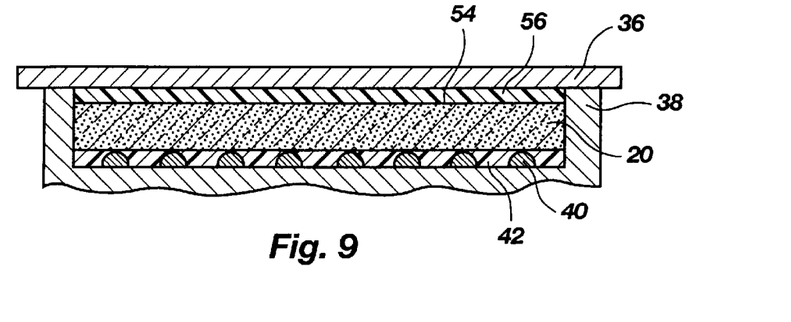
FIGS. 9 through 11 illustrate cross-sectional views of yet another alternative method of present invention wherein partial encapsulation of a semiconductor die is accomplished following completion of the process steps illustrated in FIGS. 1 through 4.

A fourth preferred fabrication process of the present invention includes forming the aforementioned semiconductor wafer according to the steps recited in conjunction with FIGS. 1 through 4. As shown in FIG. 9, the semiconductor wafer is placed into a second mold 38 and an encapsulating material is injected, under pressure, into second mold 38 to form a layer of encapsulant material 56 over a back surface 54 of the semiconductor wafer. It is understood that encapsulant material 56 can be the same or different than encapsulant 42 which was used to form a protective layer over active surface 22 of the semiconductor substrate 20.

Figure 10:
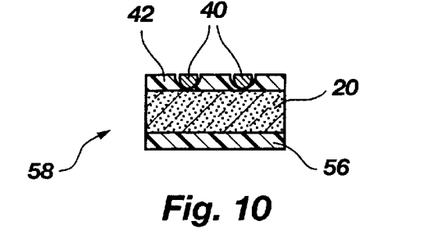
Figure 11:
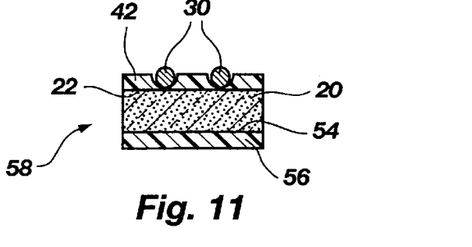

As depicted in FIG. 10, the semiconductor wafer is then removed from second mold 38 and singulated to form semiconductor die 58, which includes planarized balls 40 (i.e., conductive bumps) and encapsulant 42. Planarized balls 40 are then reflowed to form substantially spherical balls 30, as shown in FIG. 11. Accomplishment of the instant fabrication process results in a partially encapsulated semiconductor die 58. Semiconductor die 58 includes encapsulant material layers 42 and 50 that substantially cover the exposed portions of top surface 22 and a back surface 54 of semiconductor die 58. As previously discussed, encapsulant material layers 42 and 50 can consist of the same or different materials.

Alternatively, the process steps recited in conjunction with FIGS. 9 through 11 can be modified in a fifth preferred embodiment so that the semiconductor wafer of FIG. 4 is heated to form spherical balls 30 prior to placing the semiconductor wafer into second mold 38, as shown in FIG. 5. Thus, in the present process, a semiconductor wafer having reflowed ball bonds 30 (FIG. 5), rather than semiconductor die 51 having planarized balls 40 (FIG. 9), is placed in second mold 38 and encapsulated with encapsulating material 50. Thus, upon removal of the semiconductor wafer from second mold 38, the semiconductor wafer can be singulated to form semiconductor die 58 without the need to conduct the reflowing step described in conjunction with FIG. 10.

Figure 12:
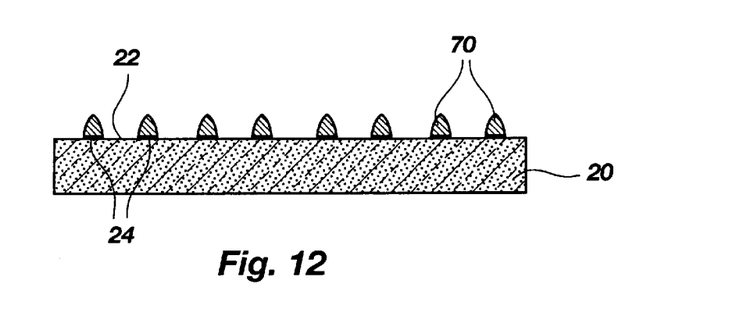
FIGS. 12 through 15 illustrate cross-cross sectional views of the process steps of yet another alternative method of the present invention wherein raised, elastomer conductive bumps are formed on a top surface of a semiconductor device and the exposed areas of the top surface are encapsulated.
Figure 13:
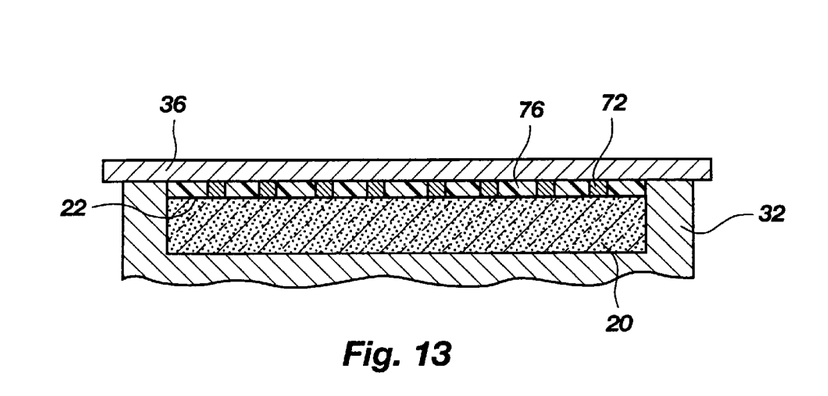

A sixth preferred fabrication process of the present invention is depicted in FIGS. 12 through 15. The instant preferred fabrication process is initiated by applying a conductive elastomer material, such as a metalized rubber, onto bond pads 24. A proper amount of conductive elastomer material must be used to adequately cover bond pads 24 and to create an elastomer bump 70 (i.e., conductive bumps) of sufficient size when the same is reshaped, as described below. The conductive elastomer material can be applied by any suitable means known in the art such as extrusion or stenciling. When applied, the elastomer bond 70 typically has a conical shape, as illustrated in FIG. 12. Referring to FIG. 13, once elastomer bumps 70 are formed, semiconductor substrate 20 is placed into mold 32. The uppermost portions of each elastomer bond 70 (FIG. 12) are planarized by compressing elastomer bumps 70 with platen 36 and fastening platen 36 to mold 32. Through this step, elastomer bumps 70 are flattened or planarized at their apex and widened so as to occupy a larger portion of the space overlying (but not necessarily connected to) top surface 22 of semiconductor substrate 20, and thus form a planarized elastomer bond 72.

A molten encapsulating material is then injected, under pressure, into mold 32 to form a layer of encapsulant 76 over the top surface 22 of semiconductor substrate 20. Encapsulant material 76 surrounds planarized balls 40, substantially covering the exposed portions of a surface 22. The thickness of encapsulating material 76 is preferably equal to or less than the height of planarized elastomer bond 72. As previously discussed above, any known encapsulant material can be used to form a protective layer over a surface 22.

Elastomer bumps 70 (i.e., conductive bumps) may be formed in any variety of suitable shapes and sizes so long as the dimensions of the bumps comply with design constraints of the final semiconductor device assembly. For most applications, elastomer bumps 70 will preferably have an average diameter of from about 5 mil to about 15 mil along a central portion thereof. Because larger and smaller elastomer bond dimensions are envisioned for a variety of structures, other sized bonds may be similarly manufactured. In this embodiment, it is desirable that the final size of elastomer bumps 70 be higher than encapsulant 76 that surrounds the completed semiconductor device fabricated according to the instant method.

Figure 14:
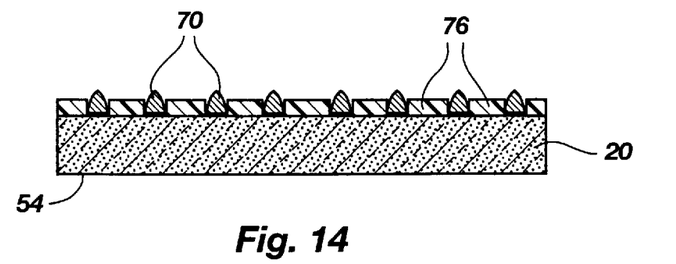
Figure 15:
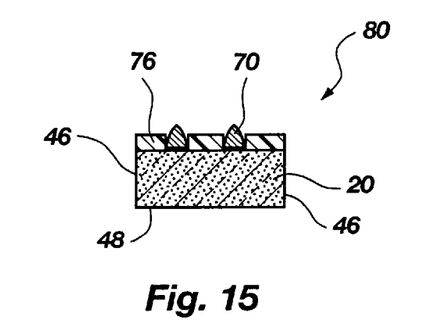

Once planarized elastomer bonds 72 have been formed and a surface 22 has been covered with encapsulant 76, platen 36 is detached from mold 32 and semiconductor substrate 20 is removed from mold 32. Due to the inherent resilient characteristics of the elastomer material used, planarized elastomer bond 72 springs back to its precompressed shape (e.g., conical) upon removal of platen 36, as shown in FIG. 14. Where the structure from FIG. 14 comprises a semiconductor wafer, the wafer can be diced or segmented to create smaller, individual subsections of the semiconductor wafer, such as a semiconductor die 80 illustrated in FIG. 15. Semiconductor die 80 can be singulated by any process known to those skilled in the art.

Side surfaces 46 and back surface 48 of semiconductor die 80 can be also be encapsulated by placing semiconductor die 80 into a second mold (such as second mold 38 in FIG. 7) and forming a layer of encapsulating material on surfaces 46 and 48, as described above with reference to the various preferred process steps of the present invention. Similarly, back surface 54 of the semiconductor wafer of FIG. 14 can be encapsulated according to the process steps described above in conjunction with FIG. 9.

Figure 16:
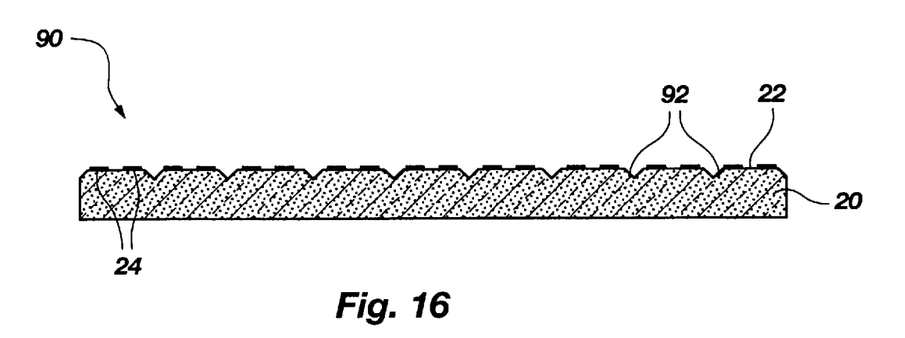
FIGS. 16 and 17 illustrate cross-sectional views of the process steps of yet another alternative method of the present invention wherein bevel-cuts are formed on an active surface of a semiconductor substrate and the active surface of the semiconductor substrate is encapsulated.
Figure 17:
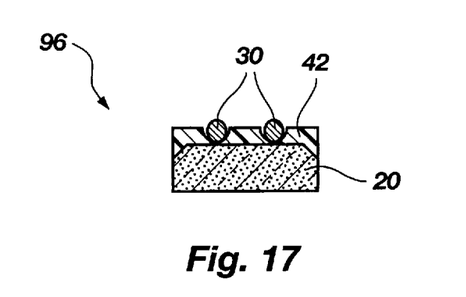

A modification of the aforementioned preferred fabrication processes of the present invention is partially depicted in FIGS. 16 and 17. The modified process is initiated by forming bevel-cuts or chamfers on top surface 22 of the semiconductor substrate 20, at a location not occupied by a bond pad 24, to form a scored semiconductor substrate 90. Thereafter, the fabrication process steps described in conjunction with FIGS. 5 through 6 are performed. Execution of these steps results in a semiconductor die 96 having an encapsulant material 42 that overlaps the active surface 22 thereof. Additionally, the semiconductor die 96 can be further encapsulated according to the process described in conjunction with FIGS. 7 and 8. It is understood that the present modification can be incorporated into the fabrication process depicted in conjunction with FIGS. 12 through 15 to produce a semiconductor die having elastomer bumps 70 thereon.

Figure 18:
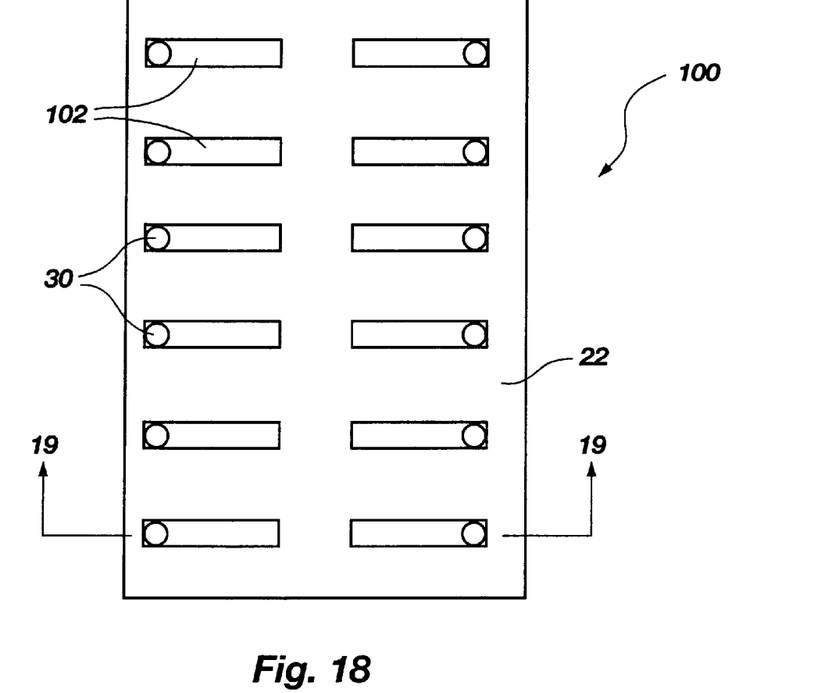
FIGS. 18 and 19 illustrate process steps of yet another alternative method of the present invention wherein conductive traces are formed on an active surface of a semiconductor substrate prior to encapsulation of the active surface of the semiconductor substrate.
Figure 19:
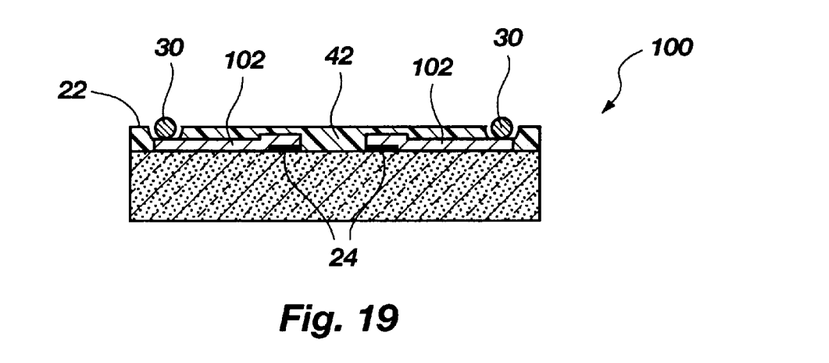

A seventh preferred fabrication process of the present invention is depicted in FIGS. 18 and 19. The instant preferred fabrication process is initiated by forming conductive traces 102 on active surface 22 of semiconductor substrate 100 that contact bond pads 24 in order to repattern the configuration or layout of bond pads 24. Repatterning of the bond pads 24 is particularly useful when reconfiguring the layout of the bond pads on an existing semiconductor substrate to conform to a particular pattern on a carrier substrate, such as a PCB. Thereafter, the fabrication process steps described in conjunction with FIGS. 1 through 6 are performed, with the solder paste 28 being applied to that end of the traces 102 opposite the end thereof attached to the bond pads 24. Execution of these steps results in a semiconductor die 100 having an encapsulant material 42 that overlaps the traces 102 on the active surface 22 of the semiconductor die 100. The semiconductor die 96 can be further encapsulated according to the process described in conjunction with FIGS. 7 and 8. It is understood that the present modification can be incorporated into the fabrication process depicted in conjunction with FIGS. 12 through 15 to produce a semiconductor die having elastomer bumps 70 thereon.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

I claim:

1. A method for forming a semiconductor device, comprising:

providing a semiconductor wafer having an active surface, said active surface having bond pads thereon;

forming a conductive bump over at least one of said bond pads, said conductive bump having a top portion;

planarizing said top portion of said conductive bump;

forming a layer of encapsulation material to partially cover said active surface of said semiconductor wafer; and reforming said conductive bump to a preplanarized shape extending above said layer.

2. The method of claim 1, wherein forming said conductive bump comprises stenciling solder paste on said pads and reflowing said paste to form round ball bumps.

3. The method of claim 1, wherein planarizing said top portion comprises placing said semiconductor wafer in a mold and compressing said top portion of said conductive bump transverse to said active surface with a platen.

4. The method of claim 1, wherein forming a layer of encapsulation material comprises at least partially overcoating said active surface of said semiconductor wafer with a resin material.

5. The method of claim 1, wherein forming a layer of encapsulation material comprises at least partially overcoating said main surface of said semiconductor wafer with a glass material.

6. The method of claim 3, wherein partially overcoating said main surface of said semiconductor wafer comprises injecting said encapsulation material into said mold.

7. The method of claim 1, wherein reforming said conductive bump comprises reflowing said conductive bump to a substantially spherical shape.

8. The method of claim 3, wherein reforming said conductive bump comprises removing said semiconductor wafer from said mold and reflowing said conductive bump to a substantially spherical shape.

9. The method of claim 1, wherein forming said conductive bump comprises depositing a conductive elastomer over said pads.

10. The method of claim 9, wherein planarizing said top portion comprises placing said semiconductor wafer in a mold and compressing said top portion of said conductive elastomer with a platen.

11. The method of claim 10, wherein reforming said conductive bump comprises removing said compression to permit said conductive elastomer to return to a precompressed shape.

12. The method of claim 1, further comprising dicing said semiconductor wafer to singulate semiconductor die therefrom.

13. The method of claim 12, wherein said singulated semiconductor die has a back and sides and further comprising forming a layer of encapsulation material on said semiconductor die to cover said back and said sides of said semiconductor die.

14. The method of claim 13, wherein forming a layer of encapsulation material on said back and sides of the semiconductor die comprises overcoating said back and said sides of the semiconductor die with a glass material.

15. The method of claim 13, wherein forming a layer of encapsulation material on said back and sides of the semiconductor die comprises overcoating said back and said sides of the semiconductor die with a plastic material.

16. The method of claim 13, wherein forming a layer of encapsulation material on said semiconductor die to fill said back and said sides of said semiconductor die comprises placing said semiconductor die into a second mold and injecting said encapsulation material into said second mold.

17. The method of claim 1, wherein said semiconductor wafer has a back surface and further comprising forming a layer of encapsulation material on said back surface to cover said back surface of said semiconductor wafer.

18. The method of claim 17, wherein said layer of encapsulation material is formed on said back surface prior to reforming said conductive bump to a preplanarized shape.

19. The method of claim 17, wherein said layer of encapsulation material is formed on said back surface after reforming said conductive bond to a preplanarized shape.

20. The method of claim 17, wherein forming a layer of encapsulation material on said back surface of said semiconductor wafer comprises overcoating said back surface of said semiconductor wafer with a glass material.

21. The method of claim 17, wherein forming a layer of encapsulation material on said back surface of said semiconductor wafer comprises overcoating said back surface of said semiconductor wafer with a plastic material.

22. The method of claim 17, wherein forming a layer of encapsulation material on said back surface of said semiconductor wafer comprises placing said semiconductor wafer into a second mold and injecting said encapsulation material into said second mold.

23. The method of claim 1, wherein said semiconductor wafer is diced prior to reforming said conductive bump to a preplanarized shape.

24. A method for forming a semiconductor device, comprising:
forming a semiconductor die having a front surface, a back surface, and sides, said front surface of said semiconductor die having active circuitry with bond pads thereover;
forming a conductive bump over at least one of said pads, said conductive bump having a top portion;
planarizing said top portion of said conductive bump;
forming a layer of encapsulation material on said semiconductor die to cover said back and said sides and to at least partially cover said front of said semiconductor die; and
reforming said conductive bump to a preplanarized shape extending above said layer.

25. The method of claim 24, wherein forming said conductive bump comprises stenciling solder paste on said pads and reflowing said paste to form round ball bumps.

26. The method of claim 24, wherein planarizing said top portion comprises placing said semiconductor wafer in a mold and compressing said top portion of said conductive bond with a platen.

27. The method of claim 24, wherein forming a layer of encapsulation material comprises overcoating said front surface, said back surface, and said sides of said semiconductor die with a plastic material.

28. The method of claim 24, wherein forming a layer of encapsulation material comprises overcoating said front surface, said back surface, and said sides of said semiconductor die with a glass material.

29. The method of claim 26, wherein forming a layer of encapsulation material of said semiconductor wafer comprises injecting said encapsulation material into said mold.

30. The method of claim 24, wherein reforming said conductive bond comprises reflowing said conductive bump to a substantially spherical shape.

31. The method of claim 24, wherein reforming said conductive bump comprises removing said semiconductor wafer from said mold and reflowing said conductive bump to a substantially spherical shape.

32. The method of claim 24, wherein forming said conductive bump comprises depositing a conductive elastomer on said pads.

33. The method of claim 32, wherein planarizing said top portion comprises placing said semiconductor wafer in a mold and compressing said top portion of said conductive elastomer with a mold clamp.

34. The method of claim 33, wherein reforming said conductive bump comprise removing said semiconductor wafer from said mold to permit said conductive elastomer to return to a precompressed shape.

* * * * *

UNITED STATES PATENT AND TRADEMARK OFFICE
CERTIFICATE OF CORRECTION

PATENT NO : 5,933,713
DATED : August 3, 1999
INVENTOR(S) : Warren M. Farnworth

It is certified that error appears in the above-identified patent and that said Letters Patent is hereby corrected as shown below:

On the title page, in the Abstract, line 4, before pads insert --bond--;

On the title page, in the Abstract, line 5, after "substrate" and before the period, insert --of a semiconductor wafer--;

On the title page, in the Abstract, line 7, change "a main" to --an active--;

Column 2, line 7, after "if the" insert --conductive--;

Column 2, line 25, change "unction" to --function--;

Column 2, line 67, after "structures" insert a comma;

Column 3, line 31, after "die" change "is" to --are--;

Column 4, line 17, delete "and";

Column 4, lines 22-23, after "encapsulated" change the period to a semicolon;

Column 4, line 29, after "encapsulated;" insert --and--;

Column 5, line 25, after "includes" insert --placing--;

Column 5, line 54, change "ball 30" to --spherical ball 30--;

Column 5, line 54, after "formed" insert a comma;

Column 5, line 57, change "balls 30" to --spherical ball 30 --;

Column 5, line 61, change "balls 30" to --spherical balls 30--;

Column 5, line 66, change "balls 30" to --spherical balls 30--;

Column 6, line 2, change "balls 30" to --spherical balls 30--;

Column 6, line 6, after "press" change "and" to --that--;

UNITED STATES PATENT AND TRADEMARK OFFICE
CERTIFICATE OF CORRECTION

PATENT NO : 5,933,713
DATED : August 3, 1999
INVENTOR(S) : Warren M. Farnworth

It is certified that error appears in the above-identified patent and that said Letters Patent is hereby corrected as shown below:

Column 6, line 8, change "substrate" to --semiconductor substrate--;

Column 6, line 10, change "balls 30" to --spherical balls 30--;

Column 6, line 21, after "injected" and before "under" delete the hyphen;

Column 6, line 54, after "of" insert a comma;

Column 6, line 54, after "to" (second occurrence) insert a comma;

Column 6, line 55, after "any" delete "the";

Column 7, line 5, after "socket" insert a comma;

Column 7, line 16, change "encapsulated" to --encapsulant--;

Column 7, line 21, after "lant" and before "42" insert --layer-- and after "over" change "top" to --active--;

Column 7, line 24, after "placed" insert --in--;

Column 7, line 29, change "substrate 20" to --semiconductor substrate 20--;

Column 7, line 33, change "44" to --51--;

Column 7, line 40, change "balls 30" to --spherical balls 30--;

Column 7, line 45, change "balls 30" to --spherical balls 30--;

Column 7, line 47, change "balls 30" to --spherical balls 30--;

Column 7, line 49, change "balls 30" to --spherical balls 30--;

Column 7, line 52, change "balls 30" to --spherical balls 30--;

Column 7, line 59, change "balls 30" to --spherical balls 30--;

UNITED STATES PATENT AND TRADEMARK OFFICE
CERTIFICATE OF CORRECTION

PATENT NO : 5,933,713
DATED : August 3, 1999
INVENTOR(S) : Warren M. Farnworth

It is certified that error appears in the above-identified patent and that said Letters Patent is hereby corrected as shown below:

Column 7, line 62, change "balls 30" to --spherical balls 30--;

Column 8, line 12, delete "(i.e. conductive bumps)";

Column 8, line 14, after "balls 30" insert --(i.e. conductive bumps)--;

Column 8, line 17, after "of" change "top" to --active--;

Column 8, line 27, change "ball bonds 30" to --spherical balls 30--;

Column 8, line 45, change "bond" to --bump--;

Column 8, line 49, change "bond' to --bump--;

Column 8, line 54, change "top" to --active--;

Column 8, line 59, change "top" to --active--;

Column 8, line 65, change "a surface 22" to --active surface 22--;

Column 9, line 13, after "and" change "a" to --active--;

Column 9, line 26, after "can" delete "be";

Column 9, line 37, after "chamfers" insert --92-- and change "top" to --active--;

Column 9, line 65, change "semiconductor die 100" to --semiconductor substrate 100--;

Column 9, line 67, change both occurrences of "semiconductor die 100" to --semiconductor substrate 100--;

Claim 5, column 10, line 40, change "main" to --active--;

Claim 6, column 10, line 42, change "3" to --4--;

Claim 6, column 10, line 43, change "main" to --active--;

UNITED STATES PATENT AND TRADEMARK OFFICE
CERTIFICATE OF CORRECTION

PATENT NO : 5,933,713
DATED : August 3, 1999
INVENTOR(S) : Warren M. Farnworth

It is certified that error appears in the above-identified patent and that said Letters Patent is hereby corrected as shown below:

Claim 16, column 11, line 13, after "to" change "fill" to --cover--;

Claim 19, column 11, line 26, change "bond" to --bump--;

Claim 24, column 12, line 5, after "back" insert --surface--;

Claim 24, column 12, line 6, after "front" insert --surface--;

Claim 26, column 12, line 15, change "wafer" to --die--;

Claim 26, column 12, line 17, change "bond" to --bump--;

Claim 29, column 12, line 27, change "wafer" to --die--;

Claim 30, column 12, line 30, change "bond" to --bump--;

Claim 31, column 12, line 34, change "wafer" to --die--;

Claim 33, column 12, line 40, change "wafer" to --die--; and

Claim 34, column 12, line 45, change "wafer" to --die--.

Signed and Sealed this

Twenty-third Day of May, 2000

*Attest:*

Q. TODD DICKINSON

*Attesting Officer*     *Director of Patents and Trademarks*